(12) United States Patent
Jung et al.

(10) Patent No.: US 11,057,040 B2
(45) Date of Patent: Jul. 6, 2021

(54) PHASE-LOCKED LOOP CIRCUIT AND CLOCK GENERATOR INCLUDING THE SAME

(71) Applicant: SAMSUNG ELECTRONICS CO., LTD., Suwon-si (KR)

(72) Inventors: Jaehong Jung, Bucheon-si (KR); Sangdon Jung, Yongin-si (KR); Kyungmin Lee, Yongin-si (KR); Byungki Han, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/006,152

(22) Filed: Aug. 28, 2020

(65) Prior Publication Data
US 2021/0111724 A1 Apr. 15, 2021

(30) Foreign Application Priority Data
Oct. 10, 2019 (KR) .................. 10-2019-0125676

(51) Int. Cl.
*H03L 7/081* (2006.01)
*H03L 7/091* (2006.01)
*H03L 7/197* (2006.01)
*H03L 7/099* (2006.01)

(52) U.S. Cl.
CPC .............. *H03L 7/081* (2013.01); *H03L 7/091* (2013.01); *H03L 7/099* (2013.01); *H03L 7/1974* (2013.01)

(58) Field of Classification Search
CPC ......... H03L 7/081; H03L 7/091; H03L 7/099; H03L 7/1974

USPC .................................. 327/147–149, 156–158
See application file for complete search history.

(56) References Cited

U.S. PATENT DOCUMENTS

| 6,603,360 | B2 | 8/2003 | Kim et al. | |
| 6,867,627 | B1* | 3/2005 | Murtagh | H03L 7/0816 |
| | | | | 327/158 |
| 7,028,206 | B2* | 4/2006 | Waller | G06F 1/12 |
| | | | | 327/149 |
| 7,135,905 | B2* | 11/2006 | Teo | H03K 5/13 |
| | | | | 327/231 |
| 7,336,752 | B2* | 2/2008 | Vlasenko | H03L 7/0818 |
| | | | | 375/376 |

(Continued)

FOREIGN PATENT DOCUMENTS

KR   10-1663546   9/2016

*Primary Examiner* — Adam D Houston
(74) *Attorney, Agent, or Firm* — F. Chau & Associates, LLC

(57) ABSTRACT

A phase-locked loop (PLL) circuit may include a voltage-controlled oscillator, a sub-sampling PLL circuit, and a fractional frequency division control circuit. The fractional frequency division control circuit may include a voltage-controlled delay line that routes a feedback signal to generate delay information, a replica voltage-controlled delay line to which the delay information is applied and configured to route a reference clock signal to generate a plurality of delay reference clock signals each delayed by up to a different respective delay time, and a digital-to-time converter (DTC) configured to generate the selection reference clock signal from the plurality of delay reference clock signals and output the selection reference clock signal to the sub-sampling PLL circuit.

20 Claims, 14 Drawing Sheets

(56) References Cited

U.S. PATENT DOCUMENTS

| | | | | |
|---|---|---|---|---|
| 7,368,961 B2* | 5/2008 | Werner | | G06F 1/04 |
| | | | | 327/156 |
| 7,375,565 B2* | 5/2008 | Kwak | | G11C 7/1072 |
| | | | | 327/158 |
| 7,425,858 B1* | 9/2008 | Daga | | H03H 11/265 |
| | | | | 327/149 |
| 9,509,323 B2 | 11/2016 | Thiagarajan et al. | | |
| 9,614,537 B1* | 4/2017 | Nandwana | | H03L 7/24 |
| 9,678,481 B1 | 6/2017 | Gao et al. | | |
| 9,705,613 B2 | 7/2017 | Ravi et al. | | |
| 9,740,175 B2 | 8/2017 | Burg et al. | | |
| 10,211,842 B2 | 2/2019 | Zhao et al. | | |
| 10,224,942 B2 | 3/2019 | Jakobsson | | |
| 10,291,214 B2* | 5/2019 | Thijssen | | H03K 5/1252 |
| 10,826,503 B1* | 11/2020 | Chen | | H03L 7/07 |
| 2002/0057118 A1* | 5/2002 | Tang | | H03L 7/14 |
| | | | | 327/158 |
| 2004/0000937 A1* | 1/2004 | Byun | | H03L 7/0891 |
| | | | | 327/158 |
| 2004/0210790 A1* | 10/2004 | Moon | | H04L 7/033 |
| | | | | 713/500 |
| 2004/0222832 A1* | 11/2004 | Chansungsan | | H03L 7/0814 |
| | | | | 327/158 |
| 2006/0170471 A1* | 8/2006 | Haerle | | H03L 7/10 |
| | | | | 327/158 |
| 2008/0129353 A1* | 6/2008 | Lin | | H03L 7/087 |
| | | | | 327/157 |
| 2010/0123494 A1* | 5/2010 | Heightley | | G11C 7/22 |
| | | | | 327/158 |
| 2011/0298507 A1* | 12/2011 | Jakobsson | | H03L 7/087 |
| | | | | 327/156 |
| 2012/0194233 A1* | 8/2012 | Kim | | H03L 7/0816 |
| | | | | 327/156 |
| 2014/0176205 A1* | 6/2014 | Nakura | | H03L 7/099 |
| | | | | 327/156 |
| 2015/0004919 A1* | 1/2015 | Ek | | H04L 7/0331 |
| | | | | 455/75 |
| 2015/0213873 A1* | 7/2015 | Joo | | H03L 7/0891 |
| | | | | 365/154 |
| 2016/0118990 A1* | 4/2016 | Faisal | | H03L 7/0997 |
| | | | | 327/156 |
| 2017/0047932 A1* | 2/2017 | Gopalakrishnan | | H03L 7/1974 |
| 2017/0324416 A1* | 11/2017 | Jakobsson | | H03L 7/0898 |
| 2018/0062660 A1* | 3/2018 | van den Heuvel | | G04F 10/005 |
| 2018/0254774 A1* | 9/2018 | Thijssen | | H03L 7/0805 |
| 2019/0020350 A1* | 1/2019 | Shu | | H03L 7/091 |
| 2019/0165794 A1* | 5/2019 | Ott | | H03C 3/0966 |
| 2019/0212703 A1* | 7/2019 | Yao | | H03L 7/0891 |
| 2020/0076440 A1* | 3/2020 | Ng | | H03L 7/081 |
| 2020/0099506 A1* | 3/2020 | Goudarzi | | H04L 7/0004 |
| 2020/0252072 A1* | 8/2020 | Wu | | G11C 29/023 |
| 2020/0373927 A1* | 11/2020 | Liang | | H03L 7/18 |

* cited by examiner

PHASE-LOCKED LOOP CIRCUIT AND CLOCK GENERATOR INCLUDING THE SAME

CROSS-REFERENCE TO RELATED APPLICATION

This application claims the benefit of Korean Patent Application No. 10-2019-0125676, filed on Oct. 10, 2019, in the Korean Intellectual Property Office, the disclosure of which is incorporated herein by reference in its entirety.

TECHNICAL FIELD

This disclosure relates generally to phase-locked loops (PLLs) and clock generators with PLLs, and more particularly to a PLL including a sub-sampling PLL for fractional frequency division-based phase locking for a clock.

DISCUSSION OF THE RELATED ART

A PLL within a clock generator or the like is a circuit that may generate a phase-locked clock signal. For example, the clock signal may be used to transmit data in a transmitter or restore data in a receiver. In this regard, the PLL may be classified into, e.g., a ring-PLL or an inductor-capacitor (LC) PLL.

Recently, a technique of locking the phase of a clock through sub-sampling has been applied to a PLL to improve noise characteristics. For instance, a sub-sampling PLL may include a phase detector and a voltage controlled oscillator (VCO), where the phase detector sub-samples an output of the VCO with a reference clock. Another technique involves fractional frequency division, which uses a fractional frequency divider in the feedback path. However, because a divider does not perform frequency division on a clock during a sub-sampling operation, this has limited the performance of a fractional frequency division operation. A technique that enables a fractional frequency division operation during a sub-sampling operation by using a digital-to-time converter has been introduced to address this limitation. However, performance of the clock generator has been degraded with this method due to limited resolution and quantization noise.

SUMMARY

Embodiments of the inventive concept provide a phase-locked loop (PLL) including a fractional frequency division control circuit having higher resolution in terms of fractional frequency division phase locking control over a clock, and which is capable of reducing quantization noise, and a clock generator including the PLL.

According to an aspect of the inventive concept, there is provided a phase-locked loop (PLL) circuit including a voltage-controlled oscillator configured to generate an output clock signal, a sub-sampling PLL circuit configured to receive the output signal as a feedback signal and based thereon, perform a fractional frequency division-based phase locking operation, and a fractional frequency division control circuit configured to provide a selection reference clock signal for the fractional frequency division-based phase locking operation to the sub-sampling PLL circuit. The fractional frequency division control circuit includes a voltage-controlled delay line configured to route the feedback signal to generate delay information, a replica voltage-controlled delay line to which the delay information is applied and configured to route a reference clock to generate a plurality of delay reference clock signals each delayed by up to a different respective delay time, and a digital-to-time converter (DTC) configured to generate the selection reference clock signal from the plurality of delay reference clock signals and output the selection reference clock signal to the sub-sampling PLL circuit.

According to another aspect of the inventive concept, there is provided a phase-locked loop (PLL) circuit including a voltage-controlled oscillator configured to generate an output clock signal, a sub-sampling PLL circuit configured to receive the output signal as a feedback signal and based thereon, perform a fractional frequency division-based phase locking operation, and a fractional frequency division control circuit configured to provide a selection reference clock signal for the fractional frequency division-based phase locking operation to the sub-sampling PLL circuit, wherein the fractional frequency division control circuit is further configured to generate delay information regarding a constant delay time within one cycle of the feedback signal by performing a delay operation using the feedback signal having a first frequency, generate a plurality of delay reference clock signals gradually delayed by up to the delay time by using a reference clock signal having a second frequency, based on the delay information, and generate the selection reference clock signal by using the plurality of delay reference clock signals.

According to another aspect of the inventive concept, there is provided a clock generator including a voltage-controlled oscillator configured to generate an output clock signal, an auxiliary phase-locked loop (PLL) circuit configured to perform an integer frequency division-based phase locking operation on the output clock signal, a sub-sampling PLL circuit configured to perform a fractional frequency division-based phase locking operation on the output clock signal after the integer frequency division-based phase locking operation, and a fractional frequency division control circuit configured to provide a selection reference clock signal for the fractional frequency division-based phase locking operation to the sub-sampling PLL circuit, wherein the fractional frequency division control circuit includes a voltage-controlled delay line configured to route of a feedback signal to generate delay information, a replica voltage-controlled delay line to which the delay information is applied, including the same characteristics as the voltage-controlled delay line, and configured to route a reference clock signal to generate a plurality of delay reference clock signals each delayed by up to a different respective delay time, and a digital-to-time converter (DTC) configured to generate the selection reference clock signal from the plurality of delay reference clock signals and output the selection reference clock signal to the sub-sampling PLL circuit.

BRIEF DESCRIPTION OF THE DRAWINGS

Embodiments of the inventive concept will be more clearly understood from the following detailed description taken in conjunction with the accompanying drawings in which like reference characters denote like elements or features, wherein.

DETAILED DESCRIPTION OF EMBODIMENTS

Hereinafter, embodiments will be described in detail with reference to the accompanying drawings.

Figure 1:
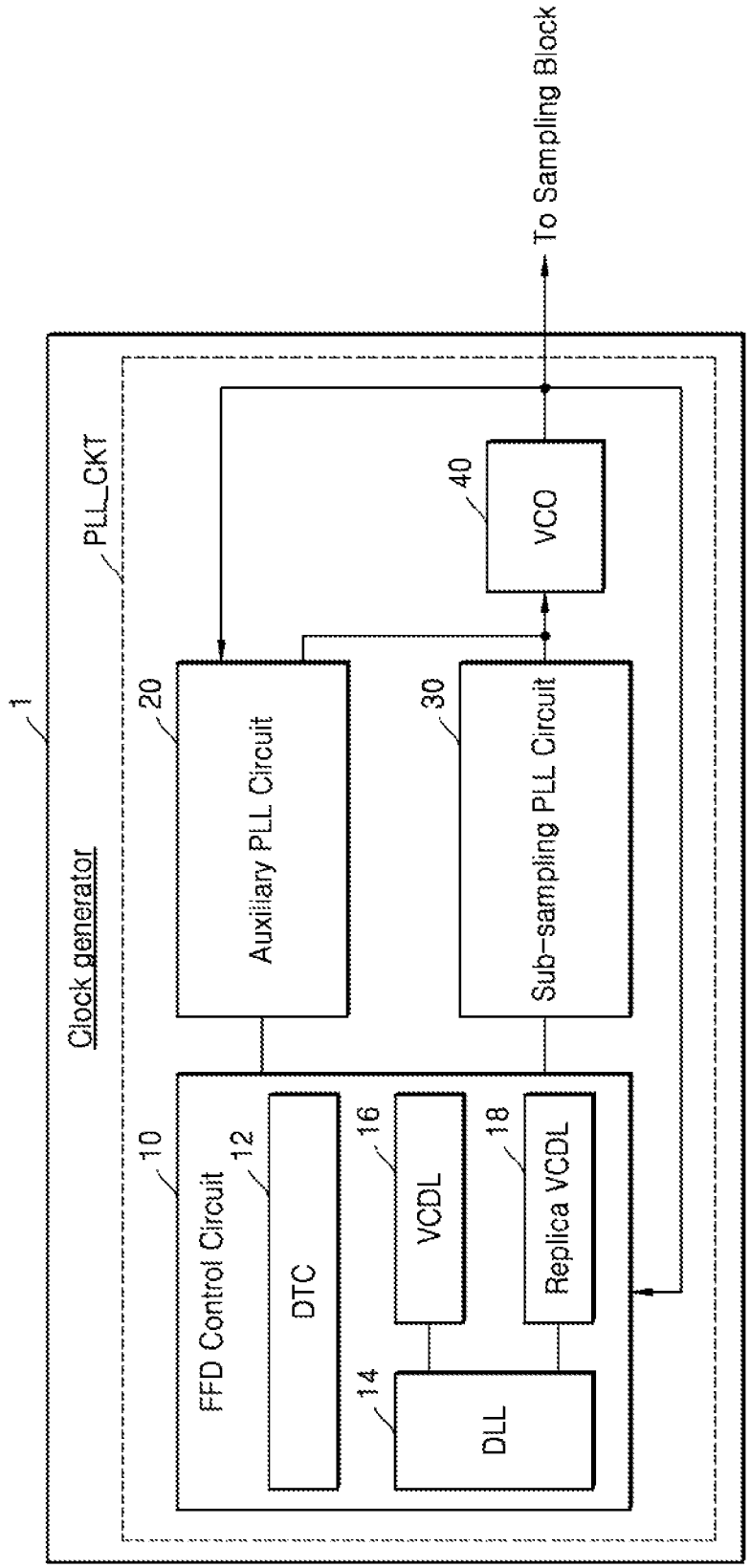
FIG. 1 is a block diagram of a clock generator according to an embodiment.

FIG. 1 is a block diagram of a clock generator 1 according to an embodiment. The clock generator 1 may include a phase-locked loop (PLL) circuit PLL_CKT, where the PLL circuit PLL_CKT may include a fractional frequency division control circuit 10, an auxiliary PLL circuit 20, a sub-sampling PLL circuit 30, and a voltage-controlled oscillator (VCO) 40. According to some embodiments, the VCO 40 may be implemented in various configurations such as a ring oscillator or an inductor-capacitor (LC) oscillator, which hereinafter may be used as examples. Hereinafter, phase delay and time delay may be used interchangeably for convenience of description. Hereafter, "PLL x" and "DLL y" will refer to "PLL circuit x" and "DLL circuit y" or the like, respectively, where "x" or "y" is the previously designated legend for the circuit element being discussed. Thus, for example, "PLL 20" will refer to PLL circuit 20 and "DLL 14" will refer to DLL circuit 14.

Figure 3A:
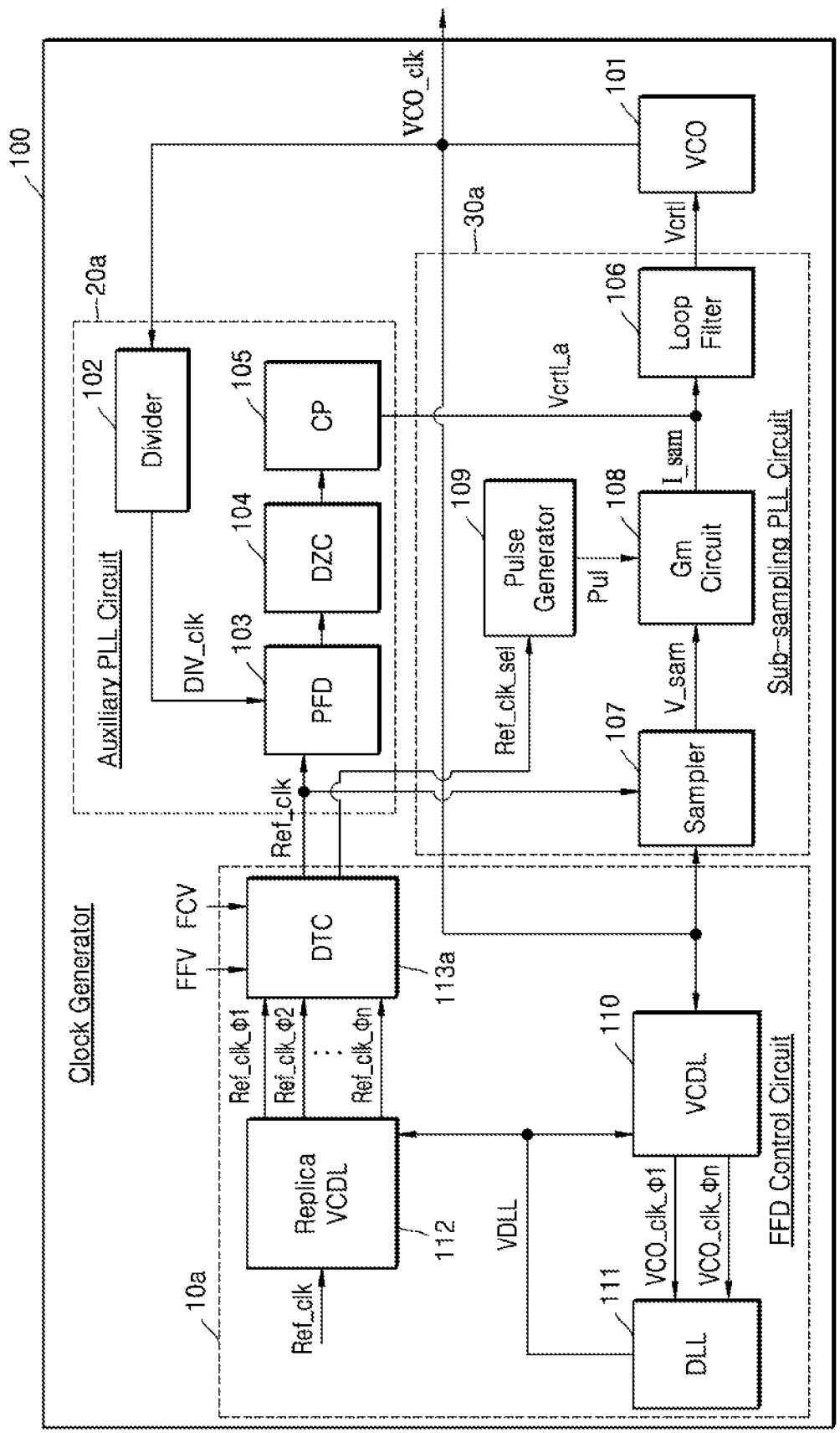
FIGS. 3A and 3B are detailed block diagrams of a clock generator according to an embodiment.

The auxiliary PLL 20 may perform a first phase locking operation by receiving an output clock signal (more generally, "oscillation signal") from the VCO 40. Hereinafter, the first phase locking operation may refer to a phase locking operation for achieving a difference between a phase of an output clock signal and a phase of a reference clock signal that falls within a certain locking range, which facilitates a second phase locking operation for an output clock signal of the sub-sampling PLL 30. Hence, the first phase locking operation may be referred to as an auxiliary phase locking operation that precedes a second phase locking operation of the sub-sampling PLL 30. Herein, the first phase locking operation performed by the auxiliary PLL 20 may be called an auxiliary PLL operation. According to an embodiment, the first phase locking operation may be an integer frequency division-based phase locking operation. In this case, an integer division ratio of the first phase locking operation may be adjusted to a fractional division ratio approximately equaling a target fractional division ratio, where the adjustment is performed by the fractional frequency division control circuit 10 described below. In this regard, the auxiliary PLL 20 may include a divider having a configuration in which a division ratio is adjusted by the fractional frequency division control circuit 10. Although FIG. 1 shows the auxiliary PLL 20 directly applying a certain control voltage signal to the VCO 40, other circuit arrangements are available. For instance, as shown in FIG. 3A described below, an auxiliary PLL 20a may share one loop filter 106 with a sub-sampling PLL 30a and may thereby apply a certain control voltage signal Vctrl to a VCO 101 through the loop filter 106.

The sub-sampling PLL 30 may receive an output clock signal (an output clock first phase-locked from the auxiliary PLL 20) from the VCO 40 in a feedback path. The output clock signal in the feedback path may therefore be referred to herein as a feedback signal. The sub-sampling PLL 30 may perform sub-sampling using the feedback signal. The sub-sampling PLL 30 may perform a fractional frequency division-based phase locking operation (or a second phase locking operation) on the feedback signal, and the sub-sampling PLL 30 may receive a selection reference clock signal for the fractional frequency division-based phase locking operation from the fractional frequency division control circuit 10. Hereinafter, the fractional frequency division control circuit 10 according to an embodiment will be described.

The fractional frequency division control circuit 10 may include a digital-to-time converter (DTC) 12, a delay-locked loop (DLL) circuit 14, a voltage-controlled delay line 16, and a replica voltage-controlled delay line 18. The voltage-controlled delay line 16 may receive an output clock signal from the VCO 40 as a feedback signal and may output a feedback signal delayed by up to a maximum phase, based on the received feedback signal. The maximum phase may differ depending on a type of an input/output signal of the VCO 40 or a target fractional division ratio. As an example, when an input/output signal of the VCO 40 is a single ended signal, the maximum phase may be 360 degrees, and as another example, when an input/output signal of the VCO 40 is a differential signal, the maximum phase may be 180 degrees. Although it is hereinafter assumed for convenience of description that an internal signal of the PLL PLL_CKT is a single ended signal, other types of signals are available. For instance, an internal signal of the PLL PLL_CKT may alternatively be a differential signal. According to an embodiment, the voltage-controlled delay line 16 may include a plurality of first delay elements connected to each other in series, and the voltage-controlled delay line 16 may have a configuration designed according to the number of phases that a selection reference clock signal which is provided to the sub-sampling PLL 30 may have. For example, as the number of phases that the selection reference clock signal may have increases, the number of first delay elements included in the voltage-controlled delay line 16 may also increase.

According to an embodiment, the DLL 14 may be connected to the voltage-controlled delay line 16 and may generate delay information by locking delay of a feedback signal delayed by passing the voltage-controlled delay line 16. For instance, the DLL 14 may generate delay information through a delay locking operation for a feedback signal passing the voltage-controlled delay line 16. The delay information may be for time delay (or phase delay) control at a first frequency (or a high frequency) of a feedback signal (or an output clock signal of the VCO 40). That is, the delay information may be for controlling a feedback signal to be delayed by a maximum of a constant delay time corresponding to one cycle of the feedback signal through the voltage-controlled delay line 16. For example, the delay information may include a bias voltage for a plurality of first delay elements included in the voltage-controlled delay line 16. The bias voltage may be applied to a delay element to allow the delay element to constantly delay a signal by a delay up to a target delay time despite the change in an operation environment of the clock generator 1 or the PLL PLL_CKT or process, voltage, and temperature (PVT) conditions. The DLL 14 may provide delay information to the replica voltage-controlled delay line 18. The DLL 14 may perform a delay locking operation for preventing harmonic lock to generate accurate delay information. For example, when a phase of a delayed feedback signal falls within a certain locking range by adjusting a delay degree of a feedback signal caused by the voltage-controlled delay line 16, the DLL 14 may start an operation for locking delay of the feedback signal.

According to an embodiment, the replica voltage-controlled delay line 18, which is a replica of the voltage-controlled delay line 16, may include a plurality of second delay elements having the same configurations or characteristics as the plurality of first delay elements included in the voltage-controlled delay line 16. The delay information received from the DLL 14 may be applied to the replica voltage-controlled delay line 18, and the replica voltage-controlled delay line 18 may generate a plurality of delay reference clock signals each delayed by up to a different respective delay time, by receiving a reference clock signal. Each of the plurality of delay reference clock signals may be delayed by a different respective amount. The reference clock signal may have a second frequency lower than a first frequency (or a high frequency) of a feedback signal (or an output clock signal of the VCO 40), and a ratio of the first frequency of the output signal (or the feedback signal) phase-locked by the sub-sampling PLL 30 and the second frequency of the reference clock signal may have a target fractional division ratio. For instance, the replica voltage-controlled delay line 18 may include a plurality of second delay elements connected in series and having delay information applied to delay a received signal as much as the same delay time as the plurality of first delay elements of the voltage-controlled delay line 16. The received signal may be delayed by the same amount as the plurality of first delay elements of the voltage-controlled delay line 16. The replica voltage-controlled delay line 18 may output a plurality of delay reference clock signals gradually delayed as much as the delay time from the received reference clock signal to the DTC 12. For example, a plurality of delay reference clock signals may be output to the DTC 12 through respective output ends of the plurality of second delay elements of the replica voltage-controlled delay line 18.

According to an embodiment, the DTC 12 may receive a plurality of delay reference clock signals from the replica voltage-controlled delay line 18, and may generate a selection reference clock signal from the plurality of delay reference clock signals and output the selection reference clock signal to the sub-sampling PLL 30. The DTC 12 may generate a selection reference clock signal having a phase adjusted based on a target fractional division ratio. For instance, the DTC 12 may select one delay reference clock signal from the plurality of delay reference clock signals and may generate a selection reference clock signal by finely adjusting delay for the selected delay reference clock signal. A fine delay range for the selected delay reference clock signal in the DTC 12 may correspond to a constant delay time between the plurality of delay reference clock signals. For example, a fine delay range for the selected delay reference clock signal in the DTC 12 may be limited within the constant delay time. The DTC 12 may generate an A-bit signal (where A is an integer of one or higher) for selecting one of the plurality of delay reference clock signals internally and may generate a B-bit signal (where B is an integer of one or higher) for adjusting delay for the selected delay reference clock signal. The A-bit signal may have a greater, lower or the same bit number as that of the B-bit signal.

According to the embodiments described above, the output clock signal of the VCO 40 may be phase-locked by the sub-sampling PLL 30, and the output clock signal may be output to a sampling block (e.g. an analog to digital converter (ADC) or a digital to analog converter (DAC)).

It is noted here that an implementation example of the clock generator 1 shown in FIG. 1 is merely an example. Minimum configurations to which the inventive concept may be applied may be designed in various other ways.

The PLL circuit PLL_CKT according to an embodiment may generate delay information through the voltage-controlled delay line 16 by receiving an output clock signal from the VCO 40 as a feedback signal, and may use a plurality of delay reference clock signals generated by providing the delay information to the replica voltage-controlled delay line 18 in a fractional frequency division-based phase locking operation, thereby efficiently increasing resolution for a phase of a selection reference clock signal. Because a selection reference clock signal is generated by using an output clock signal from the VCO 40, jitter of the output clock signal may be reflected in the selection reference clock signal. Overall jitter performance of the PLL PLL_CKT may be improved by alleviating a timing skew between the selection reference clock signal received by the sub-sampling PLL circuit 30 and the output clock signal of the VCO 40.

Figure 2:
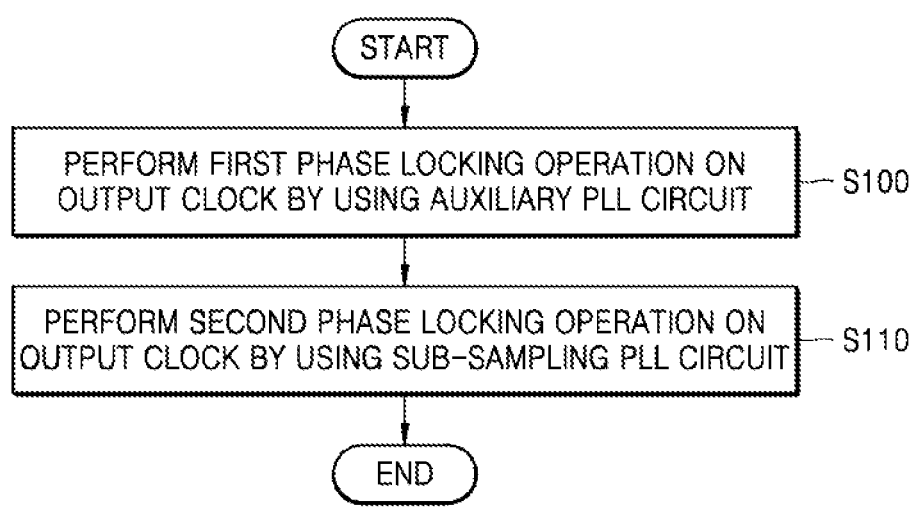
FIG. 2 is a flowchart for describing a phase locking operation of a phase-locked loop (PLL) circuit according to an embodiment.

FIG. 2 is a flowchart for describing a phase locking operation of a PLL circuit according to an embodiment. Hereinafter, FIG. 2 will be described with reference to FIG. 1.

Referring to FIG. 2, in operation S100, the PLL circuit PLL_CKT may perform a first phase locking operation for an output clock signal output from the VCO 40 by using the auxiliary PLL circuit 20. According to an embodiment, the first phase locking operation may be an integer frequency division-based phase locking operation. However, in other embodiments, the first phase locking operation may be a fractional frequency division-based phase locking operation, and a fractional division ratio of the first phase locking operation may be adjusted by the fractional frequency division control circuit 10. The auxiliary PLL circuit 20 may perform a first phase locking operation for locking a phase of an output clock signal of the VCO 40 and may perform the first phase locking operation to achieve a difference between a phase of a frequency-divided output clock signal and a phase of a reference clock signal within a certain range, hereafter referred to as a "dead zone". The auxiliary PLL circuit 20 may be deactivated when a difference between a phase of a frequency-divided output clock signal and a phase of a reference clock signal is in the dead zone.

In operation S110, the PLL PLL_CKT may perform a second phase locking operation for the output clock signal output from the VCO 40 by using the sub-sampling PLL circuit 30. According to an embodiment, the second phase locking operation may be a fractional frequency division-based phase locking operation, and a fractional division ratio of the second phase locking operation may be adjusted by the fractional frequency division control circuit 10. For example, the sub-sampling PLL 30 may receive a selection reference clock signal from the fractional frequency division control circuit 10, and thus, based on the selection reference clock signal, may perform the second phase locking operation.

The fractional frequency division control circuit 10 according to an embodiment may receive an output clock signal from the VCO 40 and may generate delay information at a frequency of the output clock signal by using the DLL 14 and the voltage-controlled delay line 16. The fractional frequency division control circuit 10 may apply the delay information to the replica voltage-controlled delay line 18 and may generate a plurality of delay reference clock signals from the reference clock signal by using the replica voltage-controlled delay line 18. The fractional frequency division control circuit 10 may generate a selection reference clock signal from the plurality of delay reference clock signals by using the DTC 12 and may output the selection reference clock signal to the sub-sampling clock 30.

Figure 3B:
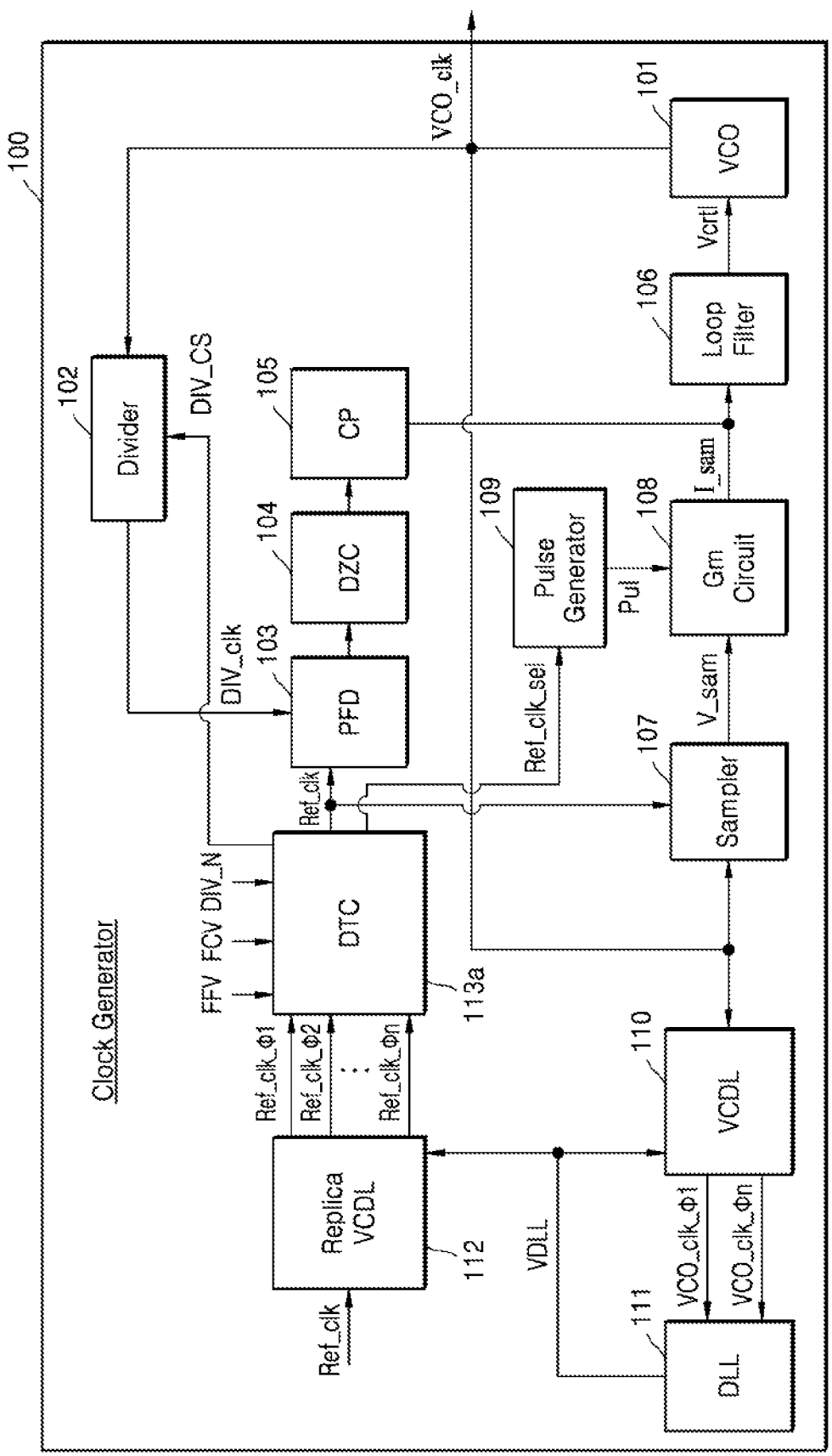

FIGS. 3A and 3B are detailed example block diagrams of a clock generator 100 according to respective embodiments. Hereinafter, although signals are simply shown in FIGS. 3A and 3B for convenience of illustration, in some embodiments, the VCO 101 may output differential signals having phases opposite to each other via two lines, and the clock generator 100 may be implemented to perform a phase locking operation by using the differential signals. FIG. 3B illustrates additional signals and signal paths that may be implemented in the clock generator 100 of FIG. 3A.

Referring to FIG. 3A, the clock generator 100 may include an auxiliary PLL circuit 20a, an FFD control circuit 10a, a sub-sampling PLL circuit 30a (which are examples of the respective circuits 20, 10 and 30 in FIG. 1), and the VCO 101. The auxiliary PLL circuit 20a may include a divider 102, a phase-frequency detector 103, a dead zone circuit 104 and a charge pump 105. The sub-sampling PLL circuit 30a may include a loop filter 106, a sampler 107, a transconductance ("Gm") circuit 108, and a pulse generator 109. The FFD control circuit 10a may include a voltage-controlled delay line 110, a DLL circuit 111, a replica voltage-controlled delay line 112, and a DTC 113a.

The clock generator 100 differs slightly from the clock generator 1 in FIG. 1 in that the auxiliary PLL circuit 20 and the sub-sampling PLL circuit 30 of FIG. 1 may share the loop filter 106 whereas the loop filter 106 is included as part of the sub-sampling PLL circuit 30a of FIG. 3A.

The VCO 101 may provide an output clock signal VCO_clk to the divider 102, where the divider 102 may frequency-divide the output clock signal VCO_clk and may provide a frequency-divided clock DIV_clk to the phase-frequency detector 103. The divider 102 may be implemented as an integer divider. The phase-frequency detector 103 may receive each of a reference clock signal Ref_clk and the frequency-divided clock DIV_clk and may provide a detection result to the dead zone circuit 104 by detecting a phase difference ("phase offset") between the reference clock signal Ref_clk and the frequency-divided clock DIV_clk. Although FIG. 3A shows the phase-frequency detector 103 receiving the reference clock signal Ref_clk from the DTC 113a, in other examples the reference clock signal Ref_clk may be received through a different path. The dead zone circuit 104 may determine whether a phase difference between the reference clock signal Ref_clk and the frequency-divided clock DIV_clk is located in a preset dead zone or not. When the phase difference is within the dead zone, the dead zone circuit 104 may, in conjunction with the other circuitry of the auxiliary PLL circuit 20a, complete a first phase locking operation, and may deactivate the auxiliary PLL circuit 20a. When the phase difference is outside the dead zone, the dead zone circuit 104 may provide a detection result received from the phase-frequency detector 103 to the charge pump 105. Based on the detection result, the charge pump 105 may generate a control voltage signal Vctrl-a and may provide the control voltage signal Vctrl-a to the loop filter 106, which may filter the same to generate the signal Vctrl, which is outputted to the VCO 101. As described above, until a phase difference between the reference clock signal Ref_clk and the frequency-divided clock DIV_clk falls within the dead zone, the first phase locking operation may be repeated using the divider 102, the phase-frequency detector 103, the dead zone circuit 104, and the charge pump 105. Subsequently, for fine phase locking of the output clock signal VCO_clk, the clock generator 100 may perform a second phase locking operation using a sub-sampling PLL circuit.

For instance, the VCO 101 may provide the output clock signal VCO_clk phase-locked through the first phase locking operation to the sampler 107 in a feedback path (and thus may be referred to herein as a feedback signal). The sampler 107 may receive each of the output clock signal VCO_clk and the reference clock signal Ref_clk, and may generate a sampling voltage signal V_sam by sampling the output clock signal VCO_clk, based on the reference clock signal Ref_clk. Although FIG. 3A shows the sampler 107 receiving the reference clock signal Ref_clk from the DTC 113a, the inventive concept is not limited thereto, and the reference clock signal Ref_clk may be received through another path. The sampler 107 may be referred to as a sub-sampling phase detector. The transconductance circuit 108 may receive the sampling voltage signal V_sam, may convert the sampling voltage signal V_sam into a sampling current signal I_sam, based on a pulse signal Pul received from the pulse generator 109, and may output the sampling current signal I_sam to the loop filter 106. The loop filter 106 may generate the control voltage signal Vctrl by filtering the sampling current signal I_sam. The pulse generator 109 may receive a selection reference clock signal Ref_clk_sel from the DTC 113a, and based on the selection reference clock signal Ref_clk_sel, may generate the pulse signal Pul. Detailed example configurations of the pulse generator 109 are described below with reference to FIG. 4, and an operation of generating the selection reference clock signal Ref_clk_sel will be described hereinafter.

The voltage-controlled delay line 110 may receive the output clock signal VCO_clk from the VCO 40, and based thereon, output: (i) a first delay output clock signal VCO_clk_Φ1 which is the same as the output clock signal VCO_clk (thereby effectively routing the output clock signal VCO_clk therethrough), and (ii) a second delay output clock signal VCO_clk which has a certain phase difference Φn-Φ1 from the first delay output clock signal VCO_clk_Φ1. The voltage-controlled delay line 110 may include a plurality of first delay elements connected in series, and the second delay output clock signal VCO_clk_Φn may be a signal generated by sequentially passing the output clock signal VCO_clk through all of the plurality of first delay elements.

The DLL circuit 111 may perform a delay locking operation using the first delay output clock signal VCO_clk_Φ1 and the second delay output clock signal VCO_clk_Φn received from the voltage-controlled delay line 110 and thus may generate delay information VDLL regarding the output clock signal VCO_clk. For example, when the number of first delay elements of the voltage-controlled delay line 110 is 'K', the delay information VDLL may include information for controlling each of the first delay elements to delay a signal as much as (Φn-Φ1)/K degrees. The delay information VDLL may be a bias voltage which is applied to each of a plurality of first delay elements of the voltage-controlled delay line 110. For example, when the second delay output clock signal VCO_clk_Φn has a 360-degree phase difference from the first delay output clock signal VCO_clk_Φ1, and the number of first delay elements of the voltage-controlled delay line 110 is 32, delay information may include information for controlling each of the first delay elements to delay a signal as much as 11.25 degrees (a delay by a time corresponding to a 11.25-degree phase difference).

The DLL circuit 111 may provide the delay information VDLL to the replica voltage-controlled delay line 112. The replica voltage-controlled delay line 112, which is a replica of the voltage-controlled delay line 110, may include a plurality of second delay elements having the same configurations or characteristics as the plurality of first delay elements included in the voltage-controlled delay line 110. The delay information VDLL received from the DLL circuit 111 may be applied to the replica voltage-controlled delay line 112. The replica voltage-controlled delay line 112 may receive the reference clock signal Ref_clk and based thereon generate a plurality of delay reference clock signals Ref_clk_Φ1 to Ref_clk_Φn; and may output the plurality of delay reference clock signals Ref_clk_Φ1 to Ref_clk_Φn to the DTC 113a. A delay time unit in the replica voltage-controlled delay line 112 having the delay information VDLL applied may be the same as or similar to a delay time unit in the voltage-controlled delay line 110. For example, when it is assumed that a delay time unit of the voltage-controlled delay line 110 is a delay time corresponding to a 11.25-degree phase difference relative to the output clock signal VCO_clk, a delay time unit in the replica voltage-controlled delay line 112 having the delay information VDLL applied may be the same as or similar to the delay time corresponding to a 11.25-degree phase difference relative to the output clock signal VCO_clk. In this regard, an $n^{th}$ delay reference clock signal Ref_clk_Φn generated by delaying the reference clock signal Ref_clk longest through the replica voltage-controlled delay line 112 may be delayed from the reference clock signal Ref_clk as much as a delay time corresponding to a 360-degree phase difference relative to the output clock signal VCO_clk.

The DTC 113a may generate the selection reference clock signal Ref_clk_sel from the plurality of delay reference clock signals Ref_clk_Φ1 to Ref_clk_Φn output from the replica voltage-controlled delay line 112, based on a frequency coarse value (FCV) and a frequency fine value (FFV). For example, the FCV and the FFV may be bit data, and when it is assumed that the FCV and the FFV are A-bit data and B-bit data, respectively, the DTC 113a may generate the selection reference clock signal Ref_clk_sel used for a fractional frequency division-based phase locking operation in [Equation 1].

The FCV, the FFV, and frequency division information DIV_N described below are external input signals which are applied to determine a frequency of a PLL itself from the outside, and the FCV, the FFV, and the frequency division information DIV_N may be adjusted to allow the PLL to cover a wide band.

$$F_{VCO\_clk} = F_{Ref\_clk} * \left\{ N - \frac{\left(FCV + \left(\frac{FFV}{2^B}\right)\right)}{2^A} \right\}$$ [Equation 1]

In [Equation 1], $F_{VCO\_clk}$ refers to a frequency of the output clock signal VCO_clk, $F_{Ref\_clk}$ refers to a frequency of the reference clock signal Ref_clk, and N refers to a certain integer division ratio. For example, N may correspond to an integer division ratio of the divider 102. $F_{VCO\_clk}$ and $F_{Ref\_clk}$ may have a target fractional division ratio through the selection reference clock signal Ref_clk_sel generated based on the FCV and the FFV. For example, an integer division ratio may be determined by adjusting N for the PLL having a target fractional division ratio, and a fractional division ratio may be determined by adjusting the FCV (A bit data) and the FFV (B bit data).

Referring to FIG. 3B, a DTC 113b according to an embodiment may further receive frequency division information DIV_N indicating an integer division ratio N of the divider 102 and thus may provide a division ratio control signal DIV_CS to the divider 102 to perform a frequency division operation at a fractional division ratio approximate to a target fractional division ratio. The DTC 113b may provide the division ratio control signal DIV_CS to the divider 102 during a first phase locking operation using the auxiliary PLL circuit 20a, and the divider 102 may be implemented in a configuration capable of changing a division ratio, based on the division ratio control signal DIV_CS.

Although FIGS. 3A and 3B show the charge pump 105 and the transconductance circuit 108 as separate configurations, this is merely an embodiment, and thus, the inventive concept is not limited thereto, and the transconductance circuit 108 of the clock generator 100 may replace the charge pump 105.

Figure 4:
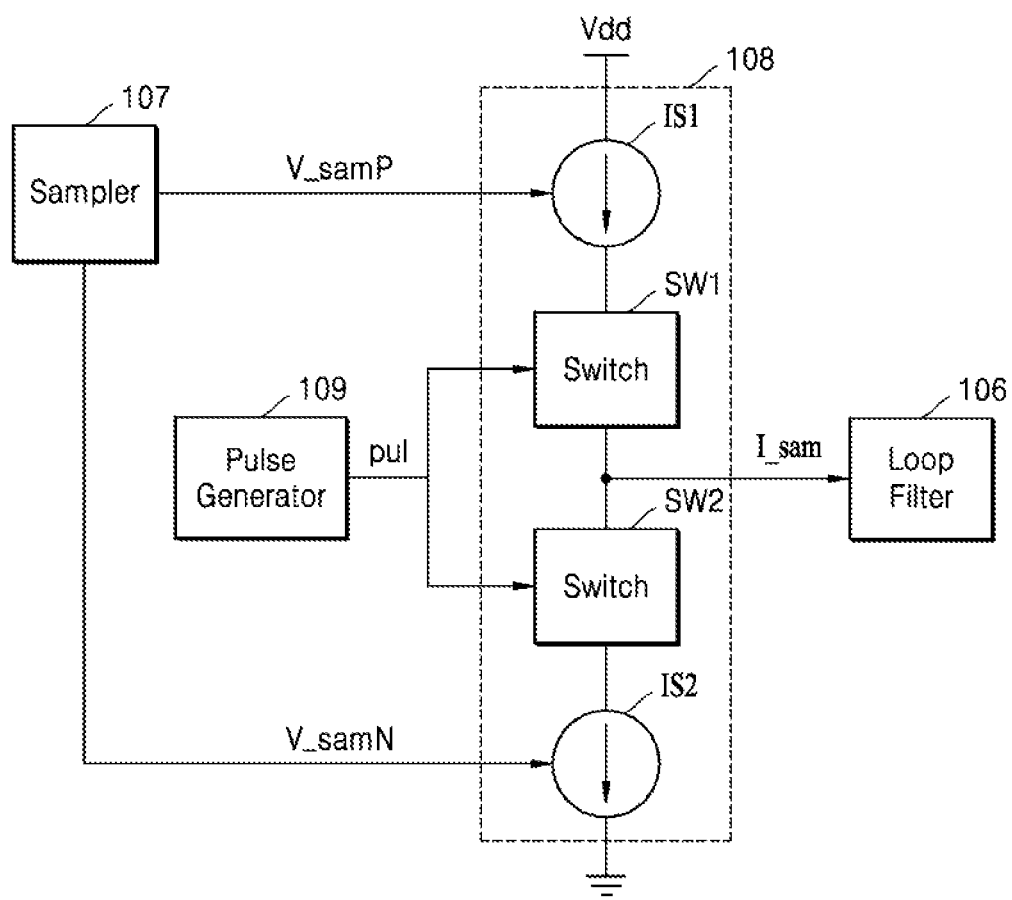
FIG. 4 is a circuit diagram of a transconductance circuit of FIG. 3A or FIG. 3B according to an embodiment.

FIG. 4 is a circuit diagram of the transconductance circuit 108 of FIG. 3A or 3B according to an embodiment.

Referring to FIG. 4, the transconductance circuit 108 may include first and second current sources IS1 and IS2 and first and second switch circuits SW1 and SW2. The first current source IS1 may generate a positive current signal by converting a positive sampling voltage signal V_samP received from the sampler 107. The second current source IS2 may generate a negative current signal by converting a negative sampling voltage signal V_samN received from the sampler 107. The first and second switch circuits SW1 and SW2 may perform a switching operation in response to the pulse signal pul by receiving the pulse signal pul from the pulse generator 109. As a result, the transconductance circuit 108 may generate the sampling current signal I_sam and output the sampling current signal I_sam to the loop filter 106. For instance, the sampling current signal I_sam of the transconductance circuit 108 may be determined by positive current signal magnitude of the first current source IS1, negative current signal magnitude of the second current source IS2, and a duty ratio of the pulse signal pul. For example, when it is assumed that a duty ratio of the pulse signal pul is 20%, magnitude of the sampling current signal I_sam may be 20% as much as positive current signal magnitude of the first current source IS1.

Figure 5:
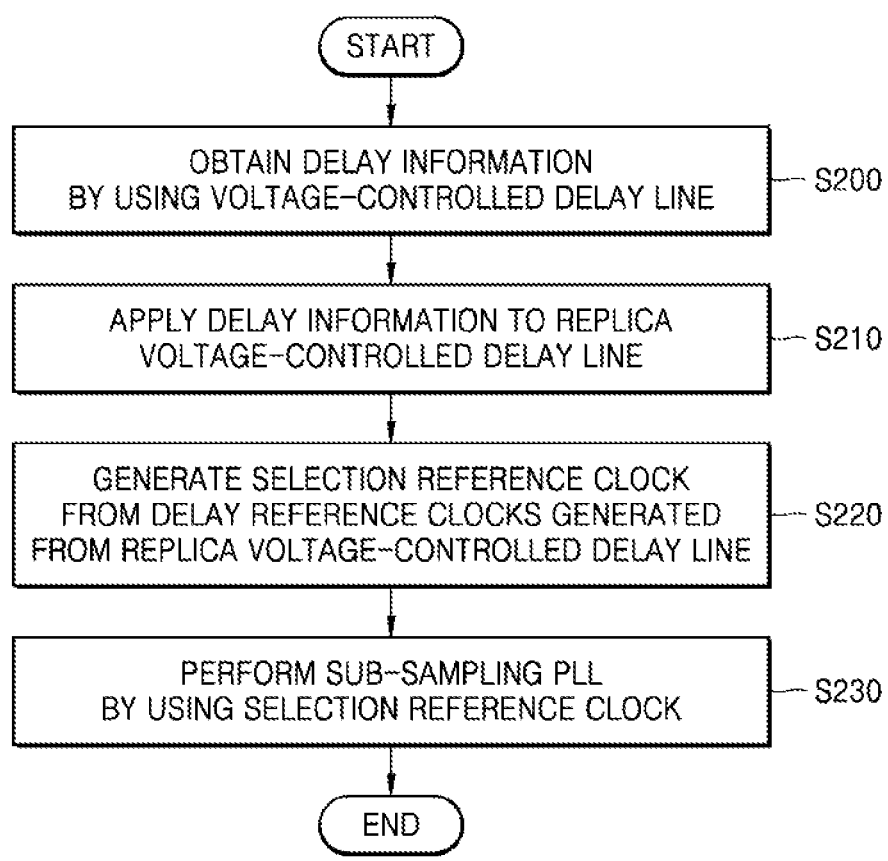
FIG. 5 is a flowchart for describing a method of performing a fractional frequency division-based sub-sampling PLL of a PLL circuit according to an embodiment.

FIG. 5 is a flowchart for describing a method of performing a fractional frequency division-based sub-sampling PLL of a PLL circuit according to an embodiment.

Referring to FIG. 5, in operation S200, a PLL circuit may obtain delay information regarding an output clock signal from a VCO by using a voltage-controlled delay line. In operation S210, the PLL circuit may apply the delay information to a replica voltage-controlled delay line. In operation S220, the PLL circuit may generate a selection reference clock signal from a plurality of delay reference clock signals generated from the replica voltage-controlled delay line. In operation S230, the PLL circuit may perform a fractional frequency division-based phase locking operation by performing a sub-sampling PLL using the selection reference clock signal.

Figure 6:
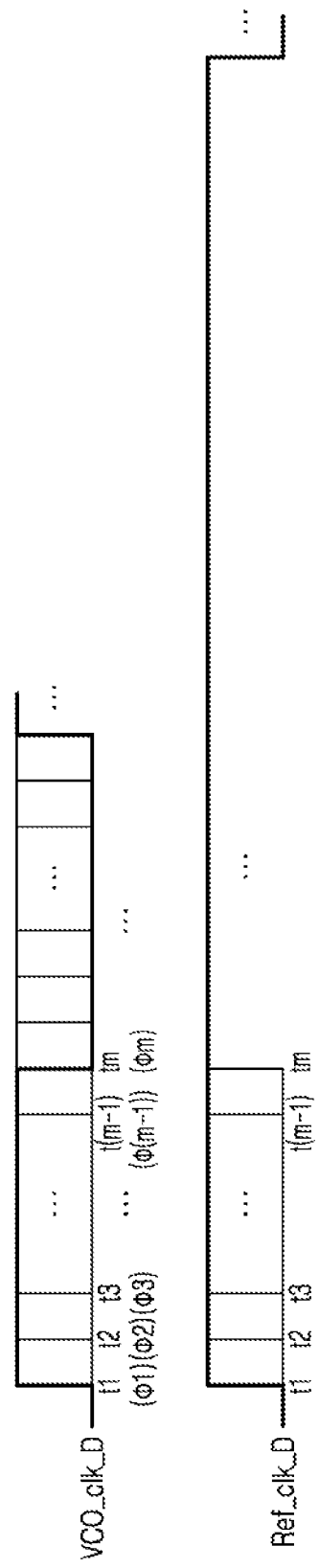
FIG. 6 is a timing diagram for describing a delay output clock signal having passed a voltage-controlled delay line and a delay reference clock signal having passed a replica voltage-controlled delay line according to an embodiment.

FIG. 6 is a timing diagram for describing a delay output clock signal VCO_clk_D having passed a voltage-controlled delay line and a delay reference clock signal Ref_clk _D having passed a replica voltage-controlled delay line according to an embodiment. Hereinafter, descriptions will be made with reference to FIG. 3A for convenience of understanding.

Referring to FIG. 6, as described above, the voltage-controlled delay line 110 may include a plurality of first delay elements, and as the output clock signal VCO_clk sequentially passes through the plurality of first delay elements, a frequency of the output clock signal VCO_clk may be step by step delayed to a first time t1 (or a first phase $\Phi1$), a second time t2 (or a second phase $\Phi2$), a third time t3 (or a third phase $\Phi3$), . . . , a $(m-1)^{th}$ time $t(m-1)$ (or a $(m-1)^{th}$ phase $\Phi(m-1)$), an $m^{th}$ time tm (or an $m^{th}$ phase $\Phi m$), etc. As shown in FIG. 3A, the voltage-controlled delay line 110 may be configured to output the second delay output clock signal VCO_clk_$\Phi$n finally delayed and the first delay output clock signal VCO_clk_$\Phi$1 having the same phase as the output clock signal VCO_clk to the DLL circuit 111. The delay information VDLL generated from the DLL circuit 111 may be for controlling the replica voltage-controlled delay line 112 to step by step delay the reference clock signal Ref_clk as much as the same delay time as the voltage-controlled delay line 110.

The replica voltage-controlled delay line 112 may include a plurality of second delay elements, and as the delay information VDLL is applied to the plurality of second delay elements, and the reference clock signal Ref_clk sequentially passes through the plurality of second delay elements, the reference clock signal Ref_clk may be step by step delayed to the first time t1, the second time t2, the third time t3, . . . , the $(m-1)^{th}$ time $t(m-1)$, the $m^{th}$ time tm, etc. The replica voltage-controlled delay line 112 may be configured to output the plurality of delay reference clock signals Ref_clk_$\Phi$1 to Ref_clk_$\Phi$n. As described above, as the delay information VDLL is applied to the replica voltage-controlled delay line 112, the reference clock signal Ref_clk may be sequentially delayed as much as a more fragmented delay time. Thus, resolution for a phase of a selection reference clock signal may improve, and further, a rise in circuit complexity may not increase.

Figure 7:
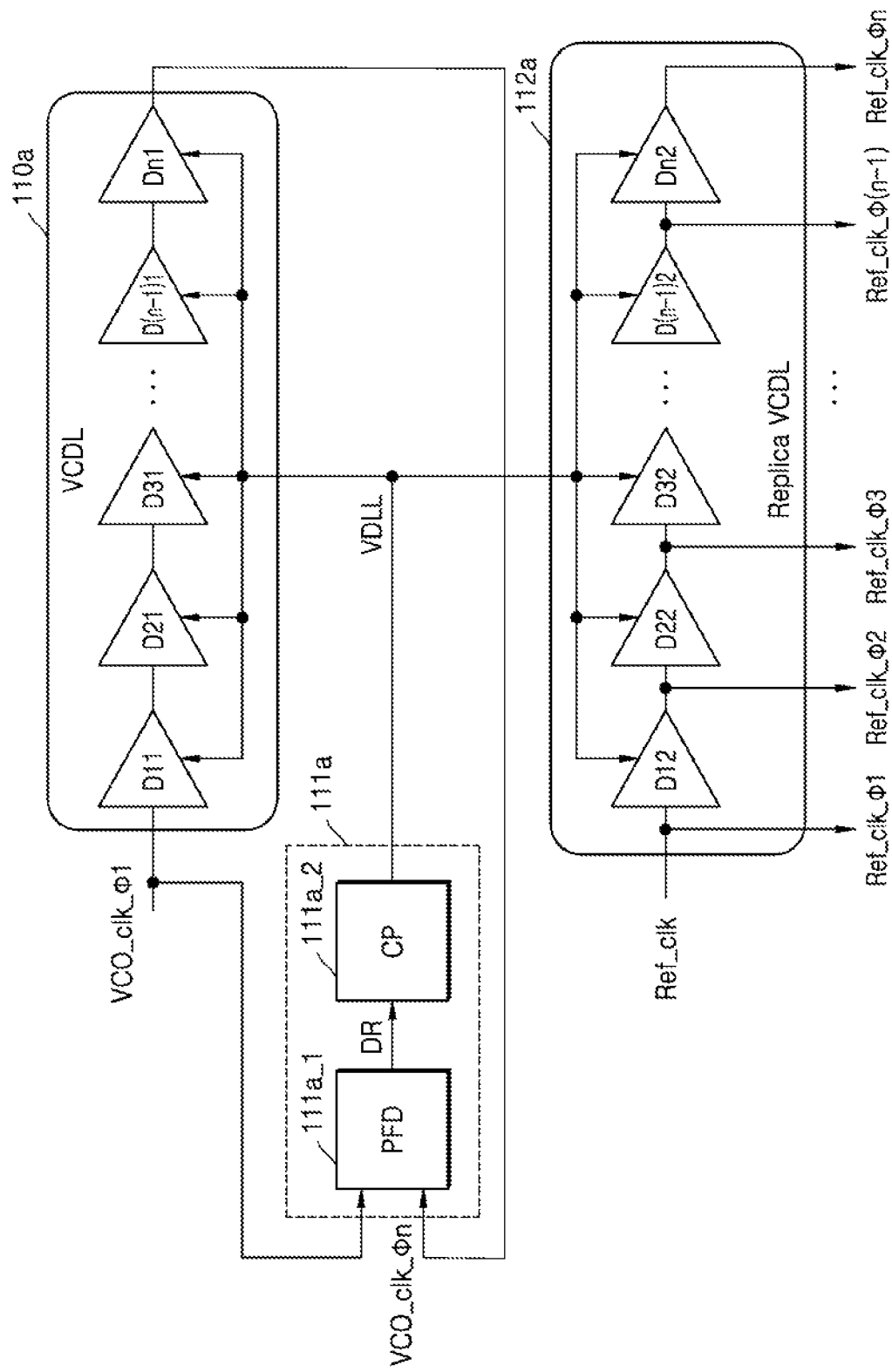
FIG. 7 is a block diagram for describing an operation of a delay-locked loop (DLL) circuit according to an embodiment.

FIG. 7 is a block diagram for describing an operation of a DLL circuit 111a according to an embodiment. The DLL circuit 111a of FIG. 7 may include a phase-frequency detector 111a_1 and a charge pump 111a_2. A voltage-controlled delay line 110a may include a plurality of first delay elements D11 to Dn1. A replica voltage-controlled delay line 112a may include a plurality of second delay elements D12 to Dn2. The replica voltage-controlled delay line 112a, which is a replica of the voltage-controlled delay line 110a, may include the plurality of second delay elements D12 to Dn2 having the same configurations or characteristics as the plurality of first delay elements D11 to Dn1 included in the voltage-controlled delay line 110a. For example, the number of the second delay elements D12 to Dn2 may be the same as that of the first delay elements D11 to Dn1.

The voltage-controlled delay line 110a may receive the first delay output clock signal VCO_clk_$\Phi$1 and may output the second delay output clock signal VCO_clk_$\Phi$n delayed through the plurality of first delay elements D11 to Dn1 to the DLL circuit 111a. For example, the first delay output clock signal VCO_clk_$\Phi$1 may be a signal that is the same as an output clock signal output from a VCO, and the second delay output clock signal VCO_clk_$\Phi$n may have a certain phase difference (for example, 360 degrees) from the first delay output clock signal VCO_clk_$\Phi$1. The phase-frequency detector 111a_1 may receive the first delay output clock signal VCO_clk_$\Phi$1 and the second delay output clock signal VCO_clk_$\Phi$n and may provide a detection result DR to a charge pump CP by detecting a phase difference therebetween. Based on the detection result DR, the charge pump CP may adjust the delay information (or a bias voltage) VDLL and provide the delay information VDLL to the plurality of first delay elements D11 to Dn1. The DLL circuit 111a may repeat the above delay locking operation until phases of the first delay output clock signal VCO_clk_$\Phi$1 and the second delay output clock signal VCO_clk_$\Phi$n are the same as each other.

The DLL circuit 111a may provide the delay information VDLL generated as a result of the repeated delay locking operation to the plurality of second delay elements D12 to Dn2 of the replica voltage-controlled delay line 112a. The replica voltage-controlled delay line 112a may delay a received reference clock signal Ref_clk step by step and may output each of the plurality of delay reference clock signals Ref_clk_$\Phi$1 to Ref_clk_$\Phi$n. The plurality of delay reference clock signals Ref_clk_$\Phi$1 to Ref_clk_$\Phi$n may be used to generate a selection reference clock signal required for a fractional frequency division-based phase locking operation using a sub-sampling PLL.

Figure 8A:
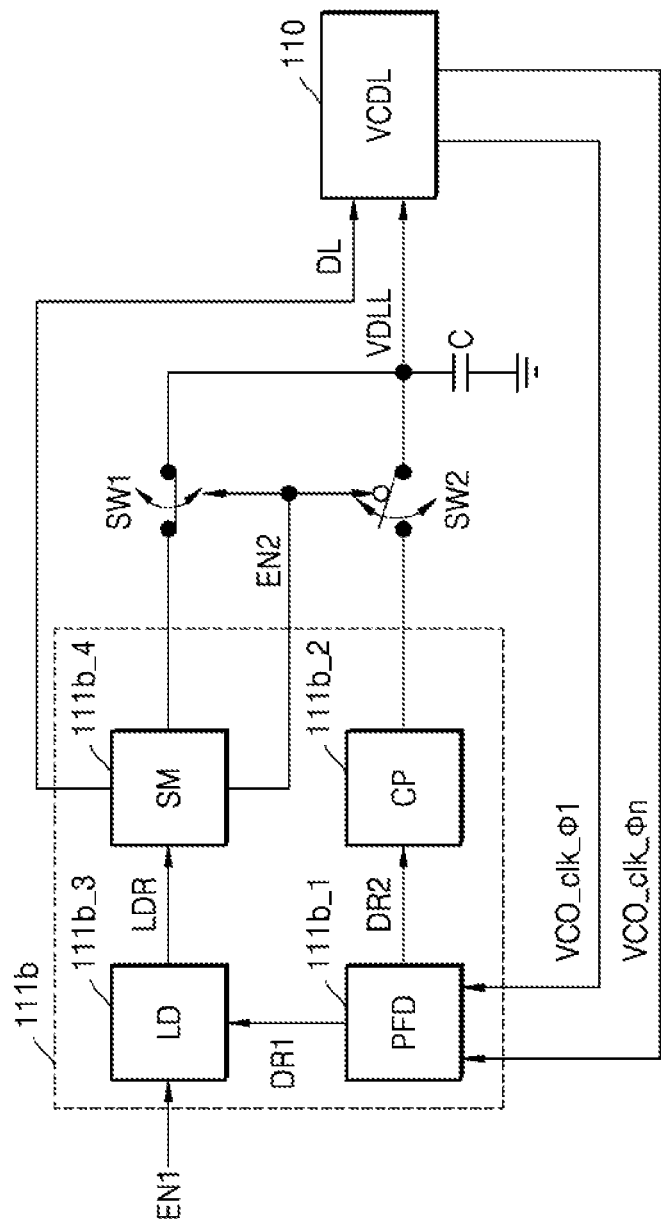
FIG. 8A is a block diagram of a DLL circuit according to an embodiment.
Figure 8B:
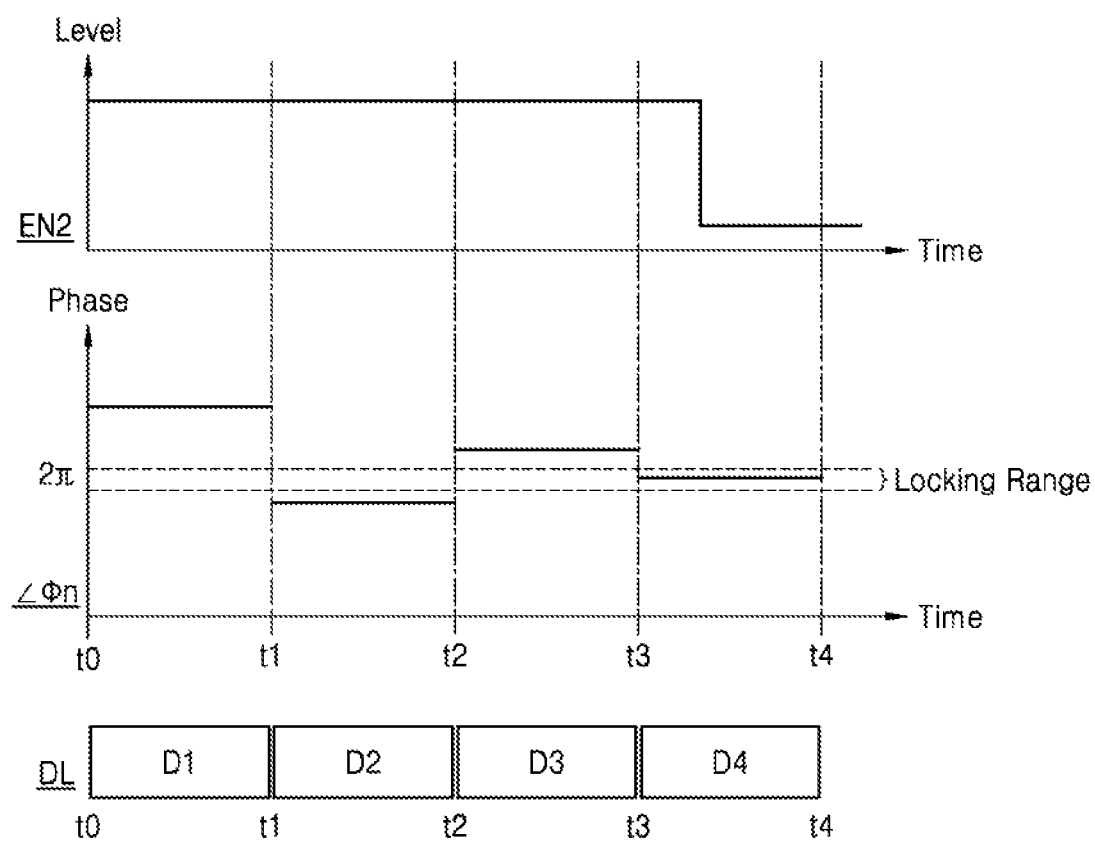
FIG. 8B is a graph for describing an operation of the DLL circuit of FIG. 8A.

FIG. 8A is a block diagram of a DLL circuit 111b according to an embodiment, and FIG. 8B is a graph for describing an operation of the DLL circuit 111b of FIG. 8A.

Referring to FIG. 8A, the DLL circuit 111b may include the first switch SW1, the second switch SW2, a phase-frequency detector 111b_1, a charge pump 111b_2, a lock detector 111b_3, and a state machine 111b_4. Before performing a delay locking operation using the charge pump 111b_2, the DLL circuit 111b may adjust delay of the second delay output clock signal VCO_clk_$\Phi$n to fall within a certain locking range and thus may prevent harmonic lock. For instance, the phase-frequency detector 111b_1 may receive the first delay output clock signal VCO_clk_$\Phi$1 and the second delay output clock signal VCO_clk_$\Phi$n from the voltage-controlled delay line 110 and may detect a phase difference therebetween and provide a first detection result DR1 to the lock detector 111b_3. The lock detector 111b_3 may be activated in response to a first activation signal EN1, may detect, based on the first detection result DR1, whether a phase of the second delay output clock signal VCO_clk_$\Phi$n falls within a certain locking range or not, and may provide a lock detection result LDR to the state machine 111b_4. Based on the lock detection result LDR, the state machine 111b_4 may provide a delay control signal DL to the voltage-controlled delay line 110. Based on the lock detection result LDR, the state machine 111b_4 may also generate a second activation signal EN2 and provide the second activation signal EN2 to the first switch SW1 and the second switch SW2.

As an example, when a phase of the second delay output clock signal VCO_clk_$\Phi$n does not fall within a certain locking range, the state machine 111b_4 may generate the second activation signal EN2 having a high level and may generate a new delay control signal DL for adjusting delay of the second delay output clock signal VCO_clk_$\Phi$n differently than before. The phase-frequency detector 111b1, the lock detector 111b_3, and the state machine 111b_4 may repeat the above operation until a phase of the second delay output clock signal VCO_clk_Φn falls within a certain locking range.

As another example, when a phase of the second delay output clock signal VCO_clk_Φn falls within a certain locking range, the state machine 111b_4 may generate the second activation signal EN2 having a low level and may stop an operation of adjusting delay of the second delay output clock signal VCO_clk_Φn. Subsequently, the phase-frequency detector 111b_1 may detect a phase difference between the first delay output clock signal VCO_clk_Φ1 and the second delay output clock signal VCO_clk_Φn and provide a second detection result DR2 to the charge pump 111b_2. Based on the second detection result DR2, the charge pump 111b_2 may generate the delay information VDLL Further referring to FIG. 8B, during an interval 't0' to 't1', the state machine 111b_4 may generate the second activation signal EN2 having a high level and the delay control signal DL having a value of 'D1'. In this regard, the phase-frequency detector 111b_1 may detect a phase difference between the first delay output clock signal VCO_clk_Φ1 and the second delay output clock signal VCO_clk_Φn and provide the first detection result DR1 to the lock detector 111b_3. Based on the first detection result DR1, the lock detector 111b_3 may detect a phase of the second delay output clock signal VCO_clk_Φn as not falling within a locking range and may provide the lock detection result LDR to the state machine 111b_4. During an interval 't1' to 't2', the state machine 111b_4 may generate the second activation signal EN2 having a high level and the delay control signal DL having a value of 'D2'. In this regard, the phase-frequency detector 111b_1 may detect a phase difference between the first delay output clock signal VCO_clk_Φ1 and the second delay output clock signal VCO_clk_Φn having delay adjusted and provide the first detection result DR1 to the lock detector 111b_3. Based on the first detection result DR1, the lock detector 111b_3 may detect a phase of the second delay output clock signal VCO_clk_Φn as not falling within a locking range and may provide the lock detection result LDR to the state machine 111b_4. During an interval 't2' to 't3', the state machine 111b_4 may generate the second activation signal EN2 having a high level and the delay control signal DL having a value of 'D3'. The phase-frequency detector 111b_1 may detect a phase difference between the first delay output clock signal VCO_clk_Φ1 and the second delay output clock signal VCO_clk_Φn having delay readjusted and provide the first detection result DR1 to the lock detector 111b_3. Based on the first detection result DR1, the lock detector 111b_3 may detect a phase of the second delay output clock signal VCO_clk_Φn as not falling within a locking range and may provide the lock detection result LDR to the state machine 111b_4. During an interval 't3' to 't4', the state machine 111b_4 may generate the second activation signal EN2 having a high level at the beginning and the delay control signal DL having a value of 'D4'. The phase-frequency detector 111b_1 may detect a phase difference between the first delay output clock signal VCO_clk_Φ1 and the second delay output clock signal VCO_clk_Φn having delay readjusted and provide the first detection result DR1 to the lock detector 111b_3. Based on the first detection result DR1, the lock detector 111b_3 may detect a phase of the second delay output clock signal VCO_clk_Φn as falling within a locking range and may provide the lock detection result LDR to the state machine 111b_4. The state machine 111b_4 may generate the second activation signal EN2 transitioned into a low level after a certain time from 't3', and in response to the second activation signal EN2 having a low level, the DLL circuit 111b may perform a delay locking operation for generating the delay information VDLL.

Figure 9:
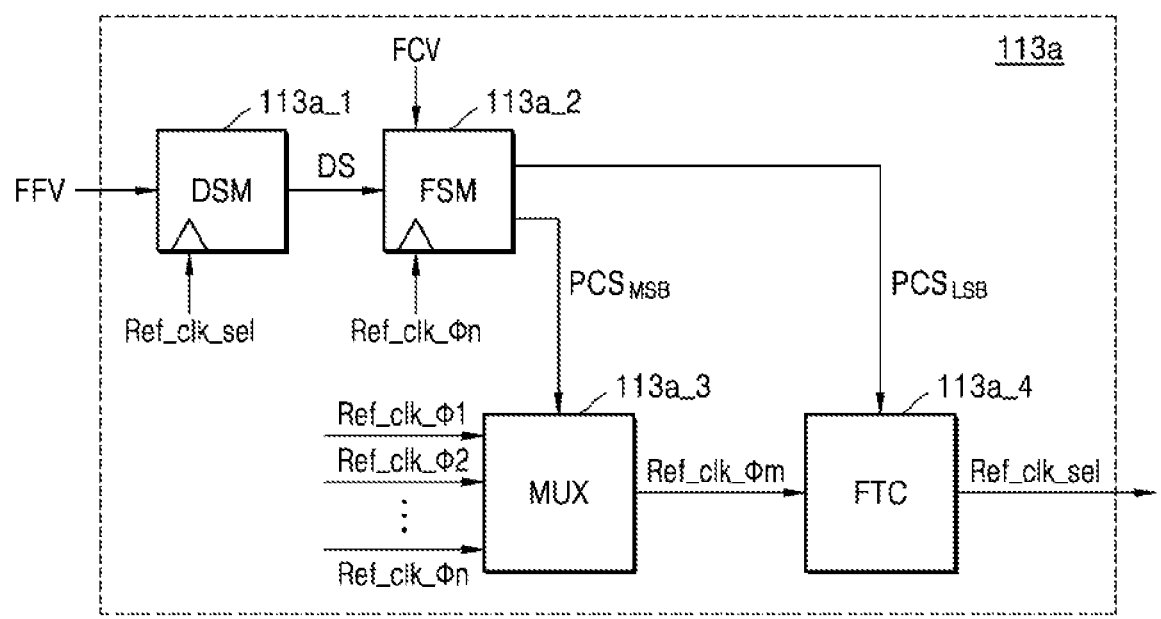
FIGS. 9 and 10 are detailed block diagrams of a digital-to-time converter according to an embodiment.
Figure 10:
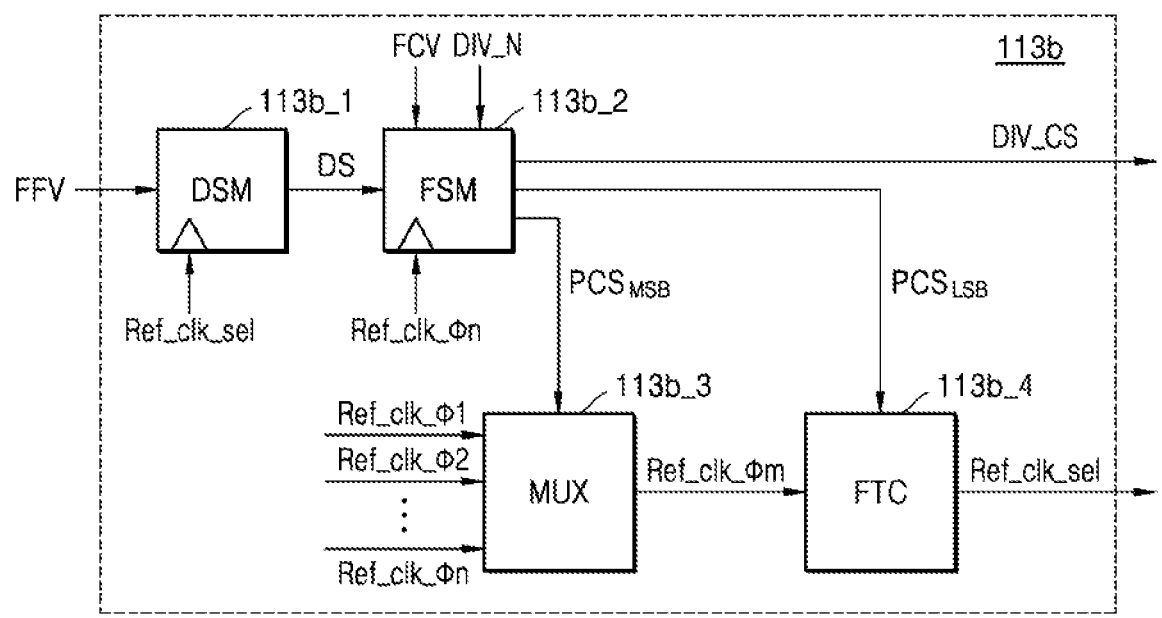

FIGS. 9 and 10 are detailed block diagrams of the DTC 113a according to an embodiment.

Referring to FIG. 9, the DTC 113a may include a delta sigma modulator 113a_1, a frequency state machine 113a_2, a multiplexer 113a_3, and a fine time control circuit 113a_4.

The delta sigma modulator 113a_1 may receive the FFV, and based on the FFV, may generate a digital sequence (DS) and provide the DS to the frequency state machine 113a_2. The FFV may be for specifying a desired frequency synthesis ratio to perform a phase locking operation according to a target fractional division ratio. The delta sigma modulator 113a_1 may generate the DS at the same time-averaged ratio corresponding to the FFV.

The frequency state machine 113a_2 may receive the DS and the FCV, and based on the DS and the FCV, may generate a phase control signal (PCS) for controlling a phase of the selection reference clock signal Ref_clk_sel. The frequency state machine 113a_2 may provide a most significant bit (MSB) part $PCS_{MSB}$ of the PCS (hereinafter referred to as a first phase control signal) to the multiplexer 113a_3 and may provide a least significant bit (LSB) part $PCS_{LSB}$ of the PCS (hereinafter referred to as a second phase control signal) to the fine time control circuit 113a_4.

The multiplexer 113a_3 may receive the plurality of delay reference clock signals Ref_clk_Φ1 to Ref_clk_Φn, and based on the first phase control signal $PCS_{MSB}$, may select one of the plurality of delay reference clock signals Ref_clk_Φ1 to Ref_clk_Φn and provide a selected delay reference clock signal Ref_clk_Φm to the fine time control circuit 113a_4. In this regard, the first phase control signal $PCS_{MSB}$ may be implemented with bit data matching the number of the plurality of delay reference clock signals Ref_clk_Φ1 to Ref_clk_Φn. For example, when the number of the plurality of delay reference clock signals Ref_clk_Φ1 to Ref_clk_Φn is 32, the first phase control signal $PCS_{MSB}$ may be implemented with 5-bit data.

The fine time control circuit 113a_4 may receive the selected delay reference clock signal Ref_clk_Φm and the second phase control signal $PCS_{LSB}$ and may generate the selection reference clock signal Ref_clk_sel by finely adjusting a delay time (or a phase) of the selected delay reference clock signal Ref_clk_Φm, based on the second phase control signal $PCS_{LSB}$. A delay adjusting range of the selected delay reference clock signal Ref_clk_Φm, which is adjusted by the fine time control circuit 113a_4, may be limited within a constant delay time between the plurality of delay reference clock signals Ref_clk_Φ1 to Ref_clk_Φn. For example, when a delay time between a first delay reference clock signal Ref_clk_Φ1 and a second delay reference clock signal Ref_clk_Φ2 is '5', the delay adjusting range may be limited within '5'.

A timing issue may arise in the frequency state machine 113a_2 due to continuous updating of the PCS. Accordingly, to resolve the above issue, the delta sigma modulator 113a_1 may be synchronized with the selection reference clock signal Ref_clk_sel output from the fine time control circuit 113a_4 to generate the DS, and the frequency state machine 113a_2 may be synchronized with the $n^{th}$ delay reference clock signal Ref_clk_Φn to generate the PCS.

Further referring to FIG. 10, the DTC 113b may include a delta sigma modulator 113b_1, a frequency state machine 113b_2, a multiplexer 113b_3, and a fine time control circuit 113b_4. Hereinafter, the frequency state machine 113b_2 further performing an additional operation compared to the frequency state machine 113a_2 of FIG. 9 will be mainly described.

The frequency state machine 113b_2 may further receive the frequency division information DIV_N indicating an integer division ratio of the divider 102 (of FIG. 3A) in an auxiliary PLL circuit and thus may generate the division ratio control signal DIV_CS for controlling the divider 102 (of FIG. 3A) to perform a frequency division operation at a fractional division ratio approximate to a target fractional division ratio. For example, during a first phase locking operation using the auxiliary PLL circuit, the frequency state machine 113b_2 may generate the division ratio control signal DIV_CS and provide the division ratio control signal DIV_CS to the divider 102 (of FIG. 3A). In this regard, the divider 102 (of FIG. 3A) may include a configuration capable of changing a division ratio, based on the division ratio control signal DIV_CS.

Figure 11:
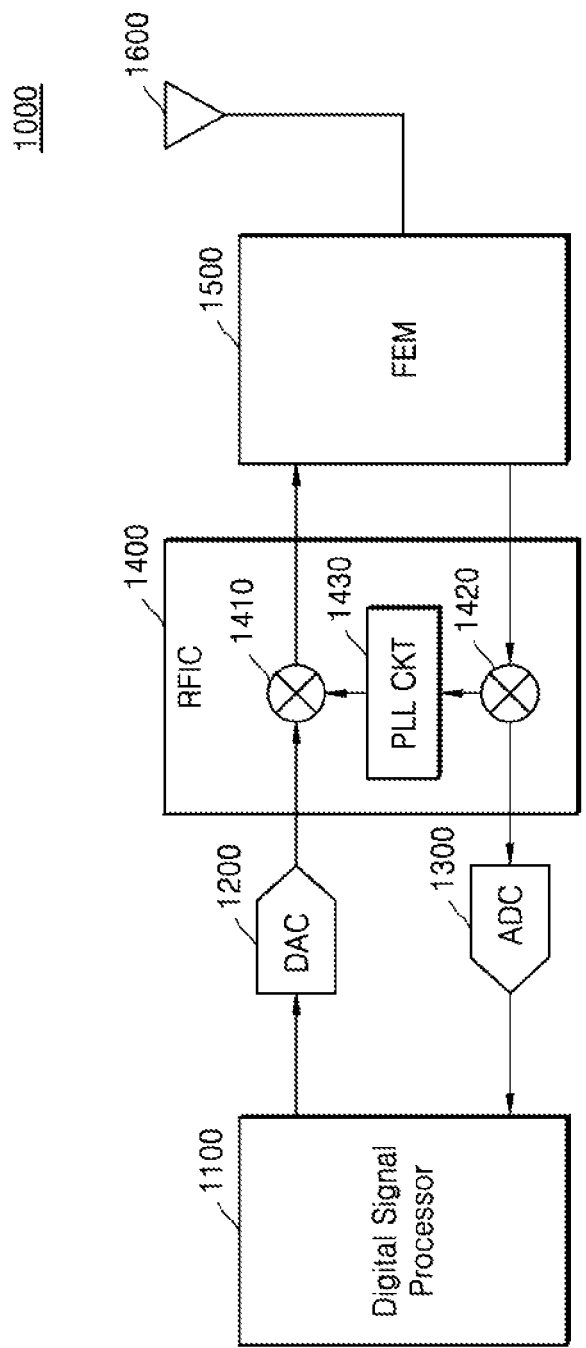
FIG. 11 is a block diagram of a wireless communication device according to an embodiment.

FIG. 11 is a block diagram of a wireless communication device 1000 according to an embodiment. The wireless communication device 1000 may include a digital signal processor 1100, a DAC 1200, an ADC 1300, a radio frequency integrated circuit (RFIC) 1400, a front end module 1500, and an antenna 1600. The digital signal processor 1100 may process a signal including information to be transmitted or received information according to a set communication scheme. For example, the digital signal processor 1100 may process a signal according to a communication scheme such as Orthogonal Frequency-Division Multiplexing (OFDM), Orthogonal Frequency-Division Multiple access (OFDMA), Wideband Code Division Multiple Access (WCDMA), or High Speed Packet Access+ (HSPA+).

The DAC 1200 may convert a digital signal including information to be transmitted into an analog signal and may provide a converted transmission signal to the RFIC 1400. The ADC 1300 may convert an analog signal received from the RFIC 1400 into a digital signal and may provide a converted digital signal to the digital signal processor 1100.

The RFIC 1400 may include a first mixer 1410, a second mixer 1420, and a PLL circuit 1430. The RFIC 1400 may generate a radio frequency (RF) signal by up-converting a frequency of a transmission signal in a baseband received from the DAC 1200 by using the first mixer 1410 and the PLL 1430. The RFIC 1400 may generate a baseband signal by down-converting a frequency of a reception signal in an RF band received from the front end module 1500 by using the second mixer 1420 and the PLL 1430. The embodiments described above with reference to FIGS. 1 to 10 may all be applied to the PLL 1430.

The front end module 1500 may include an amplifier, a duplexer, etc. The front end module 1500 may amplify an RF transmission signal provided from the RFIC 1400 and may transmit an amplified signal through the antenna 1600. In some embodiments, the wireless communication device 1000 may include a plurality of antennas 1600, and the front end module 1500 may separate an RF transmission signal for each frequency band and provide the same to the antenna 1600 corresponding thereto.

Figure 12:
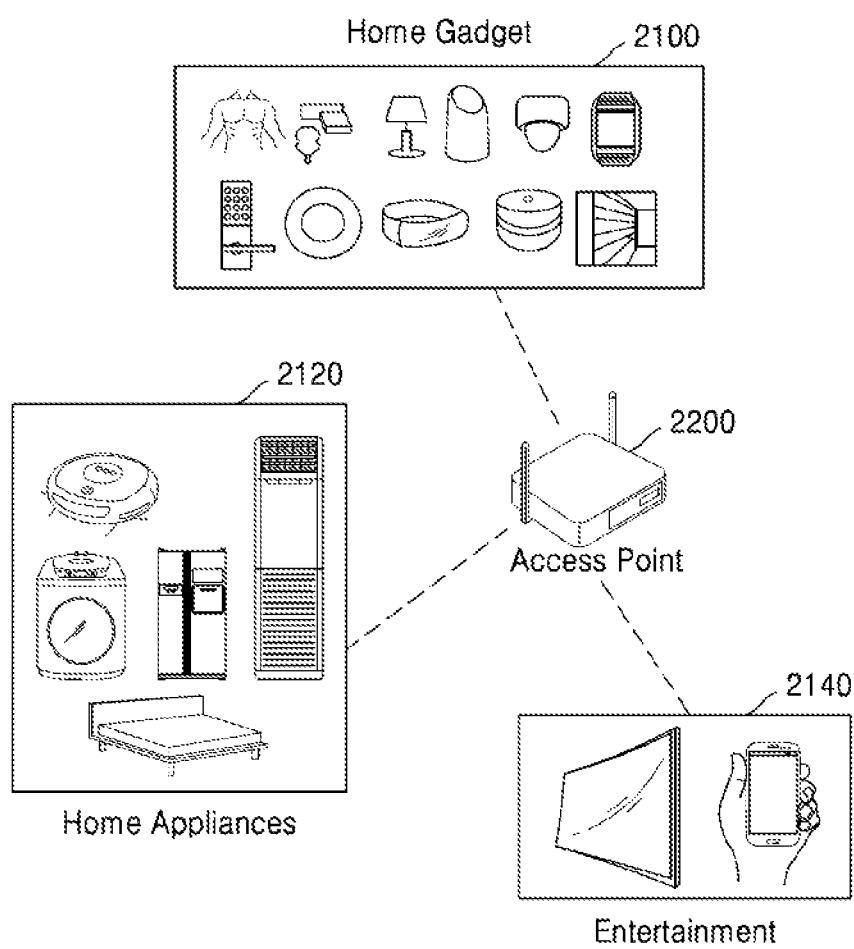
FIG. 12 is a diagram showing communication devices including clock generators for performing a phase locking operation of a clock according to an embodiment.

FIG. 12 is a diagram showing communication devices including clock generators for performing a phase locking operation of a clock according to an embodiment.

Referring to FIG. 12, home gadget 2100, home appliances 2120, entertainment 2140, and an access point (AP) 2200 may each include a clock generator for performing a phase locking operation of a clock according to embodiments. In some embodiments, the home gadget 2100, the home appliances 2120, the entertainment 2140, and the AP 2200 may configure an Internet of Things (IoT) network system. The communication devices shown in FIG. 12 are merely an example, and it will be understood that other communication devices not shown in FIG. 12 may also include a wireless communication device according to an embodiment.

Figure 13:
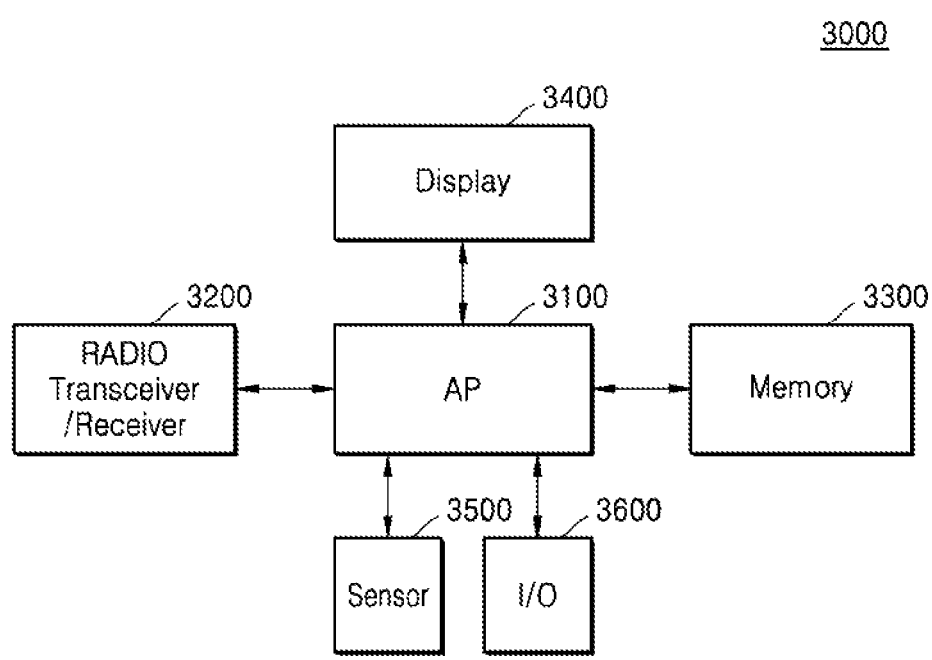
FIG. 13 is a block diagram of an Internet of Things (IoT) device according to an embodiment.

FIG. 13 is a block diagram of an IoT device 3000 according to an embodiment. The IoT device 3000 may include an application processor 3100, a transceiver 3200, a memory 3300, a display 3400, a sensor 3500, and an input/output (I/O) device 3600.

The IoT device 3000 may communicate with external entities through the transceiver 3200. The transceiver 3200 may be a modem communication interface accessible to, for example, wired local area network (LAN), wireless short-range communication interfaces such as Bluetooth, Wireless Fidelity (Wi-Fi), and Zigbee, power line communication (PLC), or mobile cellular network such as $3^{rd}$ generation (3G), long term evolution (LTE), etc. The transceiver 3200 may include a clock generator according to the embodiments described above.

The application processor 3100 may control overall operations of the IoT device 3000 and operations of configurations of the IoT device 3000. The application processor 3100 may perform various operations. In some embodiments, the application processor 3100 may include a single core or may include multi-cores.

The sensor 3500 may be, for example, an image sensor for sensing an image. The sensor 3500 may be connected to the application processor 3100 and may transmit generated image information to the application processor 3100. The sensor 3500 may be a biosensor for sensing biometric information. The sensor 3500 may be any sensor such as an illuminance sensor, an acoustic sensor, or an acceleration sensor.

The display 3400 may display internal status information of the IoT device 3000. The display 3400 may include a touch sensor (not shown). Also, the display 3400 may include an input or output function and appearance for a user interface. A user may control the IoT device 3000 through a touch sensor and a user interface.

The input/output device 3600 may include an input unit such as a touchpad, a keypad, an input button, etc. and an output unit such as a display, a speaker, etc. The memory 3300 may store control instruction code, control data, or user data for controlling the IoT device 3000. The memory 3300 may include at least one of volatile memory or nonvolatile memory.

The IoT device 3000 may further include a power supply unit including a battery for internal power supply or receiving power supply from the outside. Also, the IoT device 3000 may further include a storage device. The storage device may be a nonvolatile medium such as a hard disk (HDD), a solid state disk (SSD), an embedded multimedia card (eMMC), or a universal flash storage (UFS). The storage device may store user information provided through the input/output device 3600 and pieces of sensing information collected through the sensor 3500.

An output clock signal may be used in at least some of the above components of the IoT device 3000, for example, the application processor 3100, the transceiver 3200, the memory 3300, the display 3400, the sensor 3500, and the input/output device 3600, and the output clock signal may be generated by a clock generator according to embodiments of the inventive concept such as those described in connection with FIGS. 1-10 hereinabove.

While the inventive concept has been particularly shown and described with reference to embodiments thereof, it will be understood that various changes in form and details may be made therein without departing from the spirit and scope of the following claims.

What is claimed is:

1. A phase-locked loop (PLL) circuit comprising:
a voltage-controlled oscillator configured to generate an output clock signal;
a sub-sampling PLL circuit configured to receive the output clock signal as a feedback signal and based thereon perform a fractional frequency division-based phase locking operation; and
a fractional frequency division control circuit configured to provide a selection reference clock signal for the fractional frequency division-based phase locking operation to the sub-sampling PLL circuit,
wherein the fractional frequency division control circuit comprises:
a voltage-controlled delay line configured to route the feedback signal and to generate delay information based on the feedback signal;
a replica voltage-controlled delay line to which the delay information is applied and configured to route a reference clock signal to generate a plurality of delay reference clock signals each delayed by up to a different respective delay time; and
a digital-to-time converter (DTC) configured to generate the selection reference clock signal from the plurality of delay reference clock signals and output the selection reference clock signal to the sub-sampling PLL circuit.

2. The PLL circuit of claim 1, wherein the replica voltage-controlled delay line comprises a plurality of delay elements having the same characteristics as a plurality of delay elements included within the voltage-controlled delay line.

3. The PLL circuit of claim 1, wherein a frequency of the reference clock signal has a value obtained by applying a target fractional division ratio to a frequency of the output clock signal phase-locked by the sub-sampling PLL circuit.

4. The PLL circuit of claim 1, wherein the fractional frequency division control circuit further comprises a delay-locked loop (DLL) circuit connected to the voltage-controlled delay line and configured to generate the delay information by locking delay of the feedback signal having passed the voltage-controlled delay line.

5. The PLL circuit of claim 4, wherein the delay information comprises a bias voltage for a plurality of delay elements included in the voltage-controlled delay line.

6. The PLL circuit of claim 4, wherein the DLL circuit is connected to the replica voltage-controlled delay line and is further configured to provide the delay information to the replica voltage-controlled delay line.

7. The PLL circuit of claim 4, wherein the voltage-controlled delay line comprises a plurality of first delay elements connected in series and configured to each delay a received signal by up to the same delay time to output a delayed feedback signal having a certain phase offset from the feedback signal.

8. The PLL circuit of claim 7, wherein the replica voltage-controlled delay line comprises a plurality of second delay elements connected in series and configured to delay a received signal as much as the same delay time as the plurality of first delay elements of the voltage-controlled delay line and is further configured to output the plurality of delay reference clock signals gradually delayed from the reference clock signal to the DTC through respective output ends of the plurality of second delay elements.

9. The PLL circuit of claim 4, wherein the DLL circuit is further configured to start an operation for locking delay of the feedback signal when a phase of the delayed feedback signal falls within a certain locking range by adjusting a delay degree of the feedback signal caused by the voltage-controlled delay line to prevent harmonic lock.

10. The PLL circuit of claim 1, wherein the DTC comprises:
a multiplexer configured to output a delay reference clock signal from the plurality of delay reference clock signals; and
a fine-time control (FTC) circuit configured to generate the selection reference clock signal by adjusting delay for the delay reference clock signal output from the multiplexer.

11. The PLL circuit of claim 10, wherein a bit number of a first bit signal received for selecting of the multiplexer is greater than a bit number of a second bit signal received for the adjusting operation of the FTC circuit.

12. The PLL circuit of claim 10, wherein a delay adjusting range of the FTC circuit corresponds to a constant delay time between the plurality of delay reference clock signals.

13. The PLL circuit of claim 10, further comprising an auxiliary PLL circuit configured to perform an integer frequency division-based phase locking operation on the output clock signal prior to the fractional frequency division-based phase locking operation of the sub-sampling PLL circuit,
wherein the DTC is configured to adjust a division ratio in the integer frequency division-based phase locking operation to generate the output clock signal having a frequency approximately equal to a target division ratio of the fractional frequency division-based phase locking operation within a certain range.

14. A phase-locked loop (PLL) circuit comprising:
a voltage-controlled oscillator configured to generate an output clock signal;
a sub-sampling PLL circuit configured to receive the output clock signal as a feedback signal and based thereon perform a fractional frequency division-based phase locking operation; and
a fractional frequency division control circuit configured to:
provide a selection reference clock signal for the fractional frequency division-based phase locking operation to the sub-sampling PLL circuit;
generate delay information regarding a constant delay time within one cycle of the feedback signal by performing a delay operation using the feedback signal when the feedback signal has a first frequency;
generate a plurality of delay reference clock signals gradually delayed by up to the delay time by using a reference clock signal having a second frequency, based on the delay information; and
generate the selection reference clock signal using the plurality of delay reference clock signals.

15. The PLL circuit of claim 14, wherein, when a phase of the output clock signal is locked by the fractional frequency division-based phase locking operation, the first frequency and the second frequency comprise a target fractional division ratio.

16. The PLL circuit of claim 14, wherein the fractional frequency division control circuit comprises a digital-to-time converter (DTC) comprising:

a multiplexer configured to output a delay reference clock signal from the plurality of delay reference clock signals; and a fine-time control (FTC) circuit configured to generate the selection reference clock signal by adjusting delay for the delay reference clock signal output signal from the multiplexer.

17. The PLL circuit of claim 16, wherein the DTC further comprises a delta-sigma modulator configured to generate a first bit signal for the selecting of the multiplexer and a second bit signal for a fine-time control and a frequency state machine.

18. The PLL circuit of claim 14, wherein the fractional frequency division control circuit comprises a voltage-controlled delay line configured to receive the feedback signal to generate the delay information and a replica voltage-controlled delay line configured to receive the reference clock signal to generate the plurality of delay reference clock signals, wherein the replica voltage-controlled delay line comprises the same configurations as those of the voltage-controlled delay line to perform a gradual delay operation as much as the same delay time as the voltage-controlled delay line when the delay information is applied to the replica voltage-controlled delay line.

19. The PLL circuit of claim 18, wherein the delay information comprises a bias voltage for a plurality of delay elements comprised in the voltage-controlled delay line.

20. A clock generator comprising:
a voltage-controlled oscillator configured to generate an output clock signal;
an auxiliary phase-locked loop (PLL) circuit configured to perform an integer frequency division-based phase locking operation on the output clock signal;
a sub-sampling PLL circuit configured to perform a fractional frequency division-based phase locking operation on the output clock signal after the integer frequency division-based phase locking operation; and
a fractional frequency division control circuit configured to provide a selection reference clock signal for the fractional frequency division-based phase locking operation to the sub-sampling PLL circuit,
wherein the fractional frequency division control circuit comprises:
a voltage-controlled delay line configured to route a feedback signal to generate delay information;
a replica voltage-controlled delay line to which the delay information is applied, comprising the same characteristics as the voltage-controlled delay line, and configured to route a reference clock signal to generate a plurality of delay reference clock signals delayed by up to a different respective delay time; and
a digital-to-time converter (DTC) configured to generate the selection reference clock signal from the plurality of delay reference clock signals and output the selection reference clock signal to the sub-sampling PLL circuit.

* * * * *